(12) United States Patent
Huang et al.

(10) Patent No.: US 8,575,693 B1
(45) Date of Patent: Nov. 5, 2013

(54) DOUBLE DIFFUSED METAL OXIDE SEMICONDUCTOR DEVICE

(75) Inventors: Tsung-Yi Huang, Hsinchu (TW); Chien-Wei Chiu, Beigang Township, Yunlin County (TW); Chien-Hao Huang, Magong (TW)

(73) Assignee: Richtek Technology Corporation, Hsin-Chu (TW)

( * ) Notice: Subject to any disclaimer, the term of this patent is extended or adjusted under 35 U.S.C. 154(b) by 0 days.

(21) Appl. No.: 13/480,360

(22) Filed: May 24, 2012

(51) Int. Cl.
*H01L 29/76* (2006.01)
*H01L 29/94* (2006.01)

(52) U.S. Cl.
USPC ........... 257/337; 257/331; 257/335; 257/339; 257/341; 257/342; 438/270; 438/271

(58) Field of Classification Search
USPC .......... 257/331, 335, 339, 341, 343, E29.197, 257/E21.417; 438/270–271
See application file for complete search history.

(56) References Cited

U.S. PATENT DOCUMENTS

| | | | |
|---|---|---|---|
| 7,649,224 B2 * | 1/2010 | Kikuchi et al. | 257/342 |
| 2005/0062125 A1 * | 3/2005 | Kitaguchi | 257/492 |
| 2012/0187483 A1 * | 7/2012 | Yang et al. | 257/336 |

* cited by examiner

*Primary Examiner* — Theresa T Doan
(74) *Attorney, Agent, or Firm* — Tung & Associates

(57) ABSTRACT

The present invention discloses a double diffused metal oxide semiconductor (DMOS) device. The DMOS device is formed in a substrate, and includes a high voltage well, a first field oxide region, a first gate, a first source, a drain, a body region, a body electrode, a second field oxide region, a second gate, and a second source. The second field oxide region and the first field oxide region are separated by the high voltage well and the body region. A part of the second gate is on the second field oxide region, and another part of the second gate is on the body region. The second gate is electrically connected to the first gate, and the second source is electrically connected to the first source, such that when the DMOS device is ON, a surface channel and a buried channel are formed.

10 Claims, 7 Drawing Sheets

DOUBLE DIFFUSED METAL OXIDE SEMICONDUCTOR DEVICE

BACKGROUND OF THE INVENTION

1. Field of Invention

The present invention relates to a double diffused metal oxide semiconductor (DMOS) device; particularly, it relates to such DMOS device wherein the conduction resistance is reduced.

2. Description of Related Art

FIGS. 1A-1C show a cross-section view, a 3D (3-dimensional) view, and a top view of a prior art double diffused metal oxide semiconductor (DMOS) device 100, respectively. As shown in FIGS. 1A-1C, a P-type substrate 11 has multiple isolation regions 12 by which a device region of the DMOS device 100 is defined. The isolation regions 12 and a field oxide layer 12a for example are a local oxidation of silicon (LOCOS) structure or a shallow trench isolation (STI) structure, the former being shown in the figures. The DMOS device 100 includes an N-type well 14, a gate 13, a drain 15, a source 16, a body region 17, a body electrode 17a, and the field oxide layer 12a. The well 14, the drain 15 and the source 16 are formed by lithography process steps and ion implantation process steps, wherein the lithography process step defines the implantation region by a photoresist mask together with a self-alignment effect provided by all or part of the gate 13, and the ion implantation process step implants N-type impurities to the defined region in the form of accelerated ions. The drain 15 and the source 16 are beneath the gate 13 and at different sides thereof respectively. The body region 17 and the body electrode 17a are formed by lithography process steps and ion implantation process steps, wherein the lithography process step defines the implantation region by a photoresist mask together with a self-alignment effect provided by all or part of the gate 13, and the ion implantation process step implants P-type impurities to the defined region in the form of accelerated ions. Part of the gate 13 is above the field oxide region 12a in the DMOS device 100. The DMOS device is a high voltage device designed for applications requiring higher operation voltages. However, for operating in the high voltage environment with a higher breakdown voltage, the conduction resistance is usually sacrificed (i.e., higher conduction resistance), and thus the application range of the DMOS device is limited. Particularly, if the DMOS device 100 is an ultra-high voltage device, i.e., with operation voltage higher than 500V, it is a dilemma among the performance of the conduction resistance, the breakdown voltage, and the channel width; increasing the channel width can reduce the conduction resistance, but the manufacturing cost will be increased and the size of the device may be out of a desired range. Therefore, under the limitations of the manufacturing cost, the breakdown voltage and the channel width, it is difficult to further reduce the conduction resistance of the DMOS device.

In view of above, to overcome the drawbacks in the prior art, the present invention proposes a DMOS device which reduces the conduction resistance without sacrificing the breakdown voltage, so that the DMOS device may have a broader application range, in which additional manufacturing process steps are not required.

TOTAL OF THE INVENTION

An objective of the present invention is to provide a double diffused metal oxide semiconductor (DMOS) device.

To achieve the objective mentioned above, from one perspective, the present invention provides a DMOS device, which is formed in a first conductive type substrate, wherein the substrate has an upper surface. The DMOS device includes: a second conductive type high voltage well, which is formed in the substrate beneath the upper surface; a first field oxide region, which is formed on the upper surface, and is located in the high voltage well from top view; a first gate, which is formed on the upper surface, wherein a part of the first gate is above the first field oxide region; a second conductive type first source and a second conductive type drain, which are formed beneath the upper surface at two sides of the first gate respectively, wherein the drain and the first source are separated by the first gate and the first field oxide region from top view, and the drain is formed in the high voltage well; a first conductive type body region, which is formed in the high voltage well, wherein the first source is in the body region; a first conductive type body electrode, which is formed in the body region as an electrical contact of the body region; a second field oxide region, which is formed on the upper surface, and is located in the high voltage well from top view, wherein the second field oxide region and the first field oxide region is separated by the body region; a second gate, which is formed on the upper surface, wherein apart of the second gate is above the second field oxide region, and another part of the second gate is above the body region, wherein the second gate is electrically connected to the first gate; and a second conductive type second source, which is formed beneath the upper surface in the body region at a side of the second gate, wherein the second source and the first source are electrically connected with each other.

In one embodiment, the DMOS device may further include at least one second conductive type first buried layer, which is formed beneath and adjacent to the high voltage well in a vertical direction.

In the aforementioned embodiment, the DMOS device may include a plurality of the first buried layers, preferably each having a second conductive type impurity density higher than that of the high voltage well.

In the aforementioned embodiment, the DMOS device preferably further includes a first conductive type well, which is formed in the high voltage well and beneath the body region.

In the aforementioned embodiment, the first conductive type well is preferably adjacent to the body region in a vertical direction, and defined by a same mask with the body region.

In the aforementioned embodiment, the DMOS device may include at least one first conductive type second buried layer, formed in the substrate below the high voltage well.

In the aforementioned embodiment, the DMOS device may include a plurality of the second buried layers, each having a first conductive type impurity density preferably higher than that of the high voltage well, and the plural second buried layers and the first buried layers are preferably arranged in alternative order from top view.

In another embodiment, the DMOS device may further include at least one second conductive type deep well, which is formed below the drain and/or the second gate in the high voltage well.

In the aforementioned embodiment, the deep well has a second conductive type impurity density preferably higher than that of the high voltage well.

In another embodiment, when the DMOS device is ON, preferably, a surface channel is formed between the drain and the first source, and a buried channel is formed between the drain and the second source.

The objectives, technical details, features, and effects of the present invention will be better understood with regard to the detailed description of the embodiments below.

DESCRIPTION OF THE PREFERRED EMBODIMENTS

The drawings as referred to throughout the description of the present invention are for illustration only, to show the interrelations between the regions and the process steps, but not drawn according to actual scale.

Figure 1A:
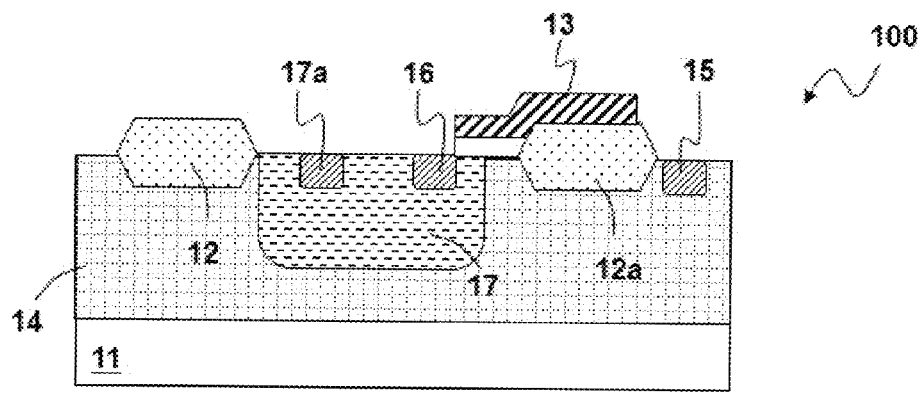
FIGS. 1A-1C show a cross-section view, a 3D (3-dimensional) view, and a top view of a prior art double diffused metal oxide semiconductor (DMOS) device 100, respectively.
Figure 1B:
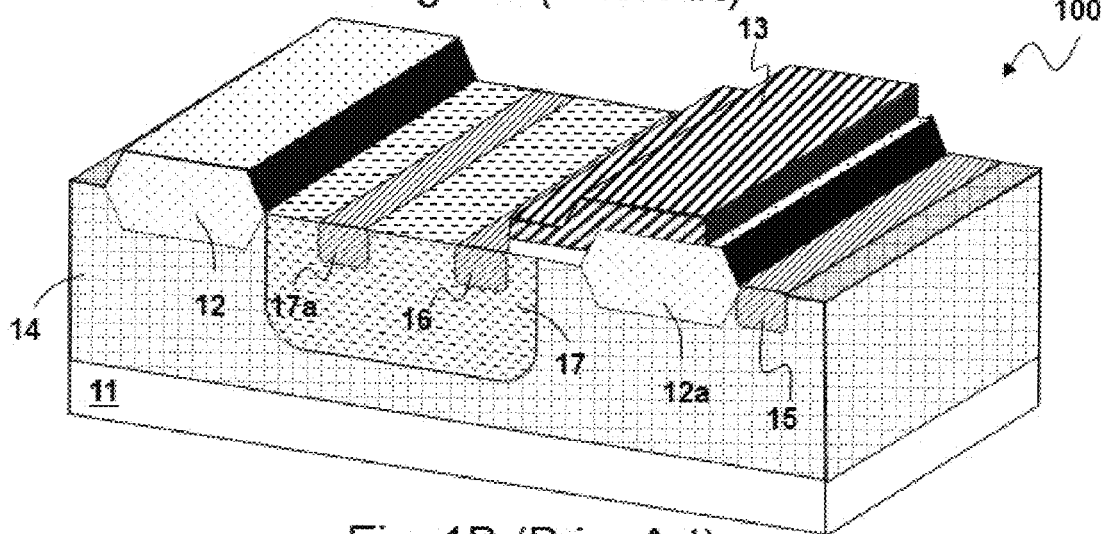
Figure 1C:
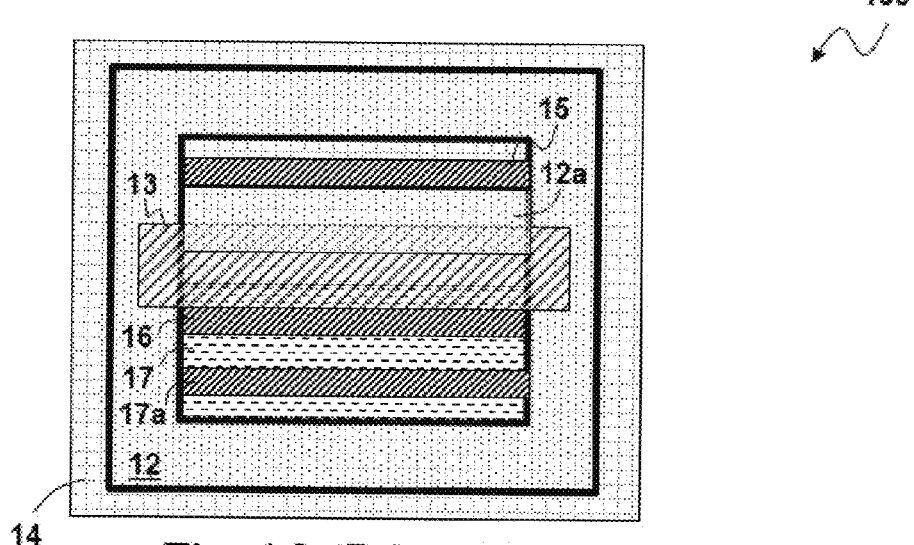
Figure 2A:
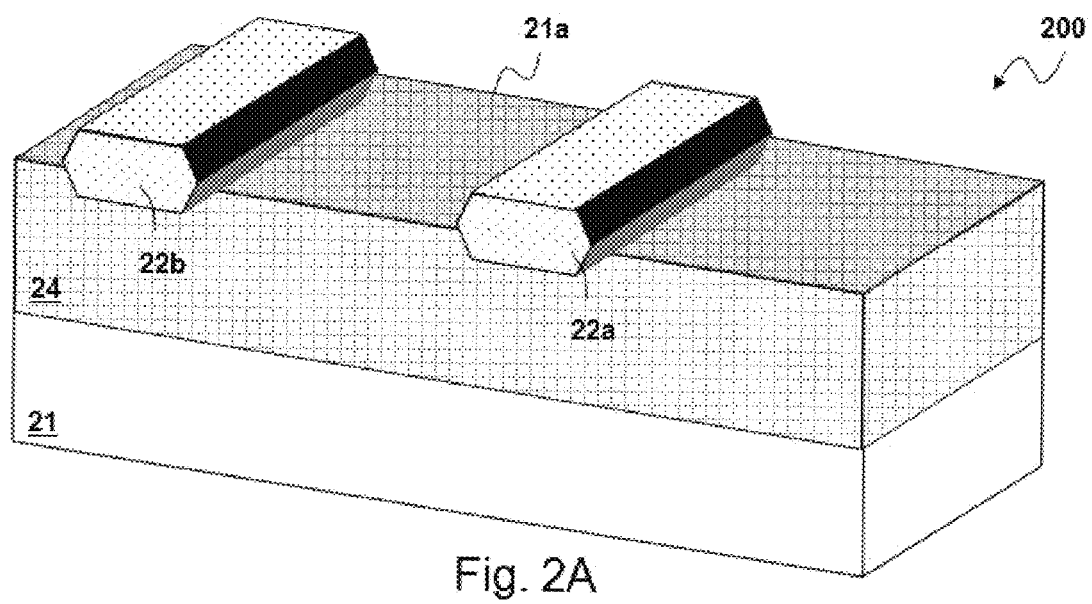
FIGS. 2A-2C show a first embodiment of the present invention.
Figure 2B:
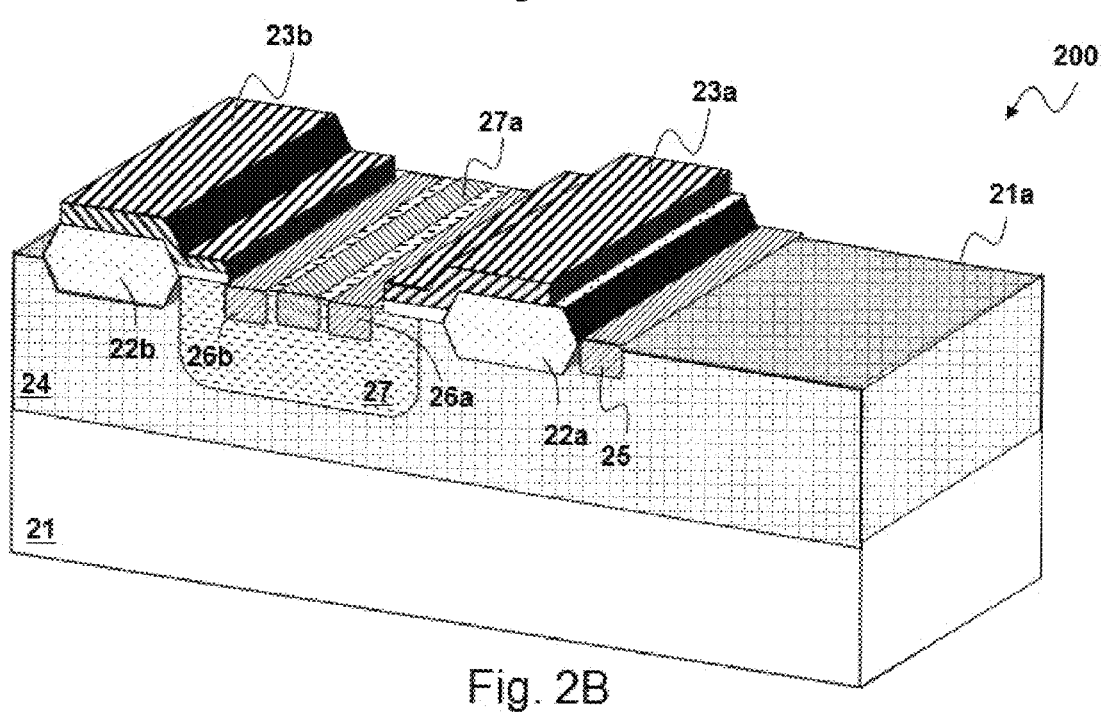
Figure 2C:
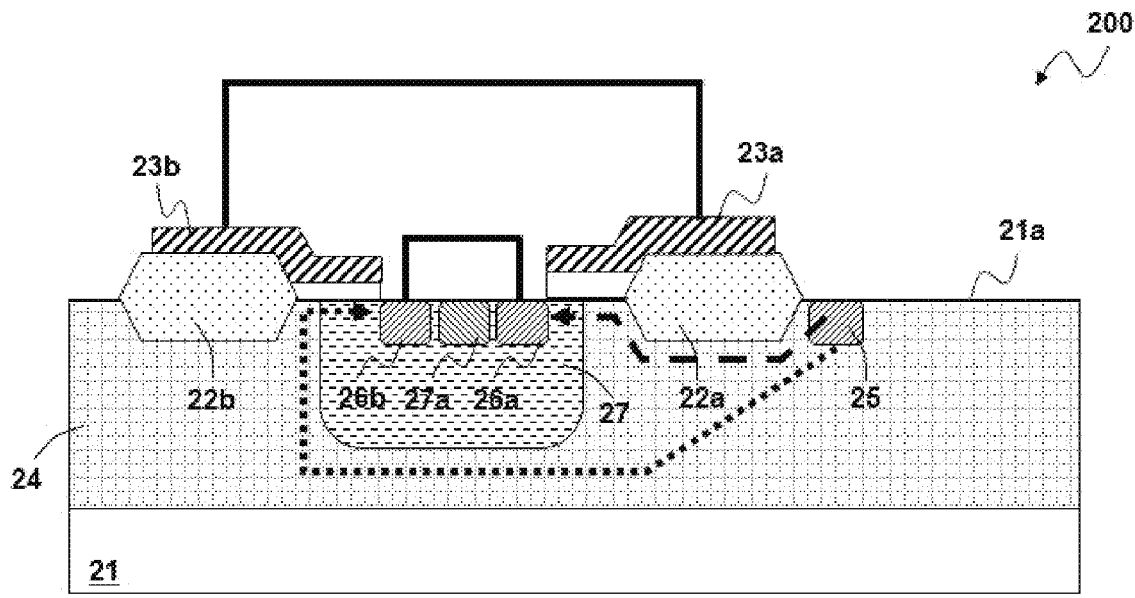

Please refer to FIGS. 2A-2C for a first embodiment according to the present invention, wherein FIGS. 2A-2B are 3D schematic diagrams showing a manufacturing method of a DMOS device 200 according to the present invention, and FIG. 2C is a cross-section view of the DMOS device 200. As shown in FIGS. 2A and 2B, first, a substrate 21 with an upper surface 21a is provided, wherein the substrate 21 is for example but not limited to a P-type substrate (or an N-type substrate in another embodiment). The substrate 21 for example is a non-epitaxial silicon substrate, or an epitaxial substrate. Next, an N-type high voltage well 24 is formed beneath the upper surface 21a by a lithography process step and an ion implantation process step, wherein the lithography process step defines the implantation region by a photoresist mask (not shown), and the ion implantation process step implants N-type impurities to the defined region in the form of accelerated ions. Next, as shown in FIG. 2A, field oxide regions 22a and 22b are formed on the upper surface 21a, wherein the field oxide regions 22a and 22b are, for example, a LOCOS or an STI structure (the former being shown in FIGS. 2A-2C). The field oxide regions 22a and 22b may be formed by for example but not limited to the same process steps, and the field oxide regions 22a and 22b are located in the high voltage well 24 from top view (the drawings do not show this top view but illustrate it by the 3D diagrams of FIGS. 2A and 2B). The field oxide regions 22a and 22b are separated by the high voltage well 24 and a body region 27 (shown in FIG. 2B).

Next, as shown in FIG. 2B, gates 23a and 23b, a drain 25, sources 26a and 26b, a body region 27, and a body electrode 27a are formed. As shown in FIG. 2B, the gates 23a and 23b are formed on the upper surface 21a, wherein a part of the gate 23a is above the field oxide region 22a, a part of the gate 23b is above the field oxide region 22b, and another part of the gate 23b is located on the body region 27. The drain 25 and the source 26a for example are N-type but not limited to N-type, and they are beneath the upper surface 21a and at different sides of the gate 23a in the high voltage well 24. The drain 25 and the source 26a are separated by the gate 23a and the field oxide region 22a from top view (the drawings do not show this top view but illustrate it by the 3D diagram). The source 26b is formed at a side of the gate 23b, beneath the upper surface 21a in the body region 27. Note that both the sources 26a and 26b are formed in the body region 27 and electrically connected to each other (referring to FIG. 2C, indicated by the bold folded line). The electrical connection between the sources 26a and 26b for example may be achieved by a conductive plug and a metal line in later interconnection process steps, or by a doped region in the substrate 21 (such as by directly connecting the sources 26a and 26b themselves, or by connecting them though another doped region). The body region 27 for example is P-type but not limited to P-type, and it is formed in the substrate 21 beneath the upper surface 21a. The body electrode 27a is formed in the body region 27 as an electrical contact of the body region 27.

This embodiment is different from the prior art in that, the DMOS device 200 includes two field oxide regions 22a and 22b, two gates 23a and 23b, and two sources 26a and 26b, and they are electrically connected to each other respectively. Hence, when the DMOS device 200 operates in an ON condition, a surface channel between the drain 25 and the source 26a (as indicated by the sparse folded dash arrow line in FIG. 2C) is formed, and a buried channel between the drain 25 and the source 26b (as indicated by the dense folded dash arrow line in FIG. 2C) is formed. This arrangement is advantageous over the prior art in that: First, the DMOS device of the present invention has a relatively lower conduction resistance because of the extra buried channel in the DMOS device. Second, in manufacturing process, no additional process step or mask is required, that is, the field oxide region 22b, the gate 23b, and the source 26b may be formed by the same process steps with the field oxide region 22a, the gate 23a, and the source 26a without an additional process step. As such, the DMOS device in the present invention has a lower conduction resistance while it can be manufactured by a low cost.

Figure 3:
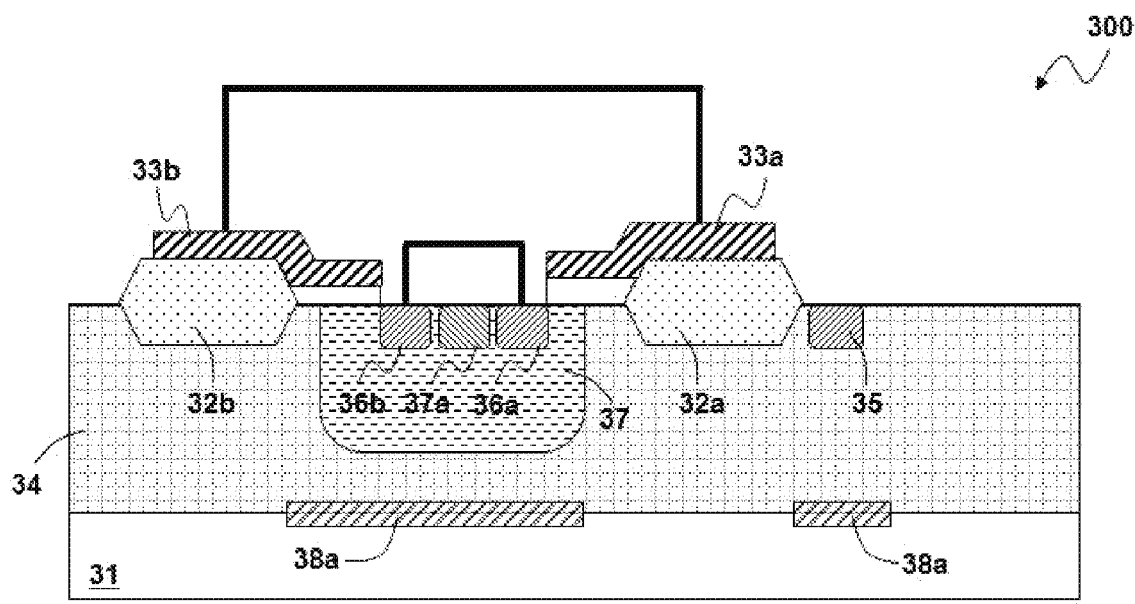
FIG. 3 shows a second embodiment of the present invention.

FIG. 3 shows a second embodiment of the present invention. FIG. 3 is a schematic diagram showing a cross-section view of a DMOS device 300 of the present invention, which is formed in a substrate 31 and includes field oxide regions 32a and 32b, gates 33a and 33b, a high voltage well 34, a drain 35, sources 36a and 36b, a body region 37, and a body electrode 37a. This embodiment is different from the first embodiment in that, as shown in FIG. 3, the DMOS device 300 further includes at least one N-type buried layer 38a formed beneath and adjacent to the high voltage well 34 in a vertical direction. Note that the N-type impurity density in the buried layer 38a is preferably higher than that of the high voltage well 34, and a preferable arrangement is to form multiple buried layers 38a which are not directly connected below the high voltage 34, such that the conduction resistance may be further decreased by reducing the resistance in the buried channel, with lower impact on the breakdown voltage between the P-type substrate 31 and N-type high voltage well 34 in the OFF operation.

Figure 4:
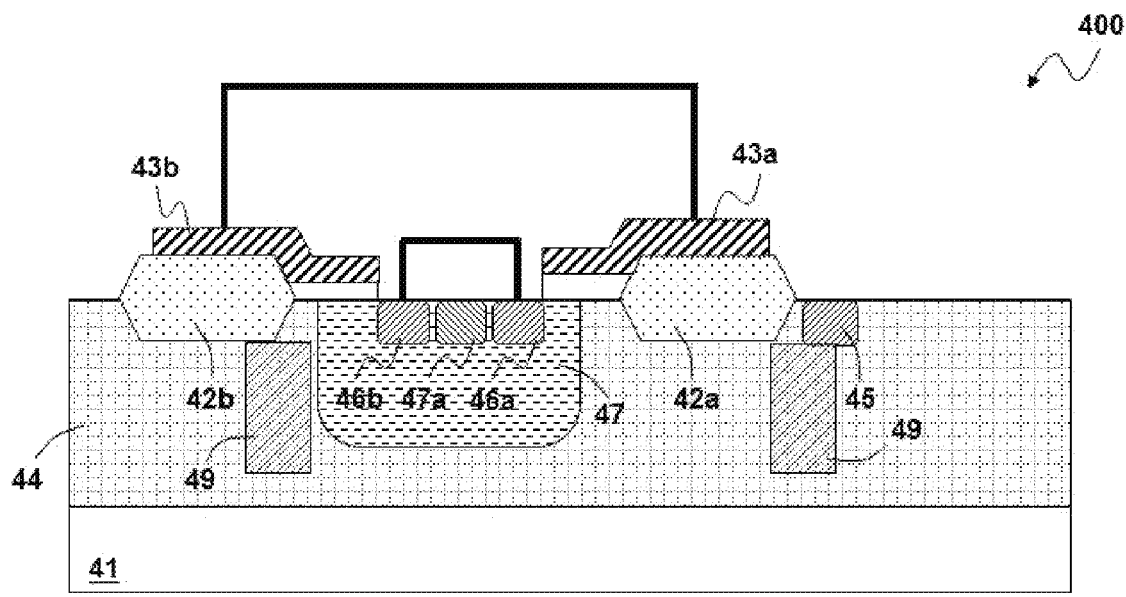
FIG. 4 shows a third embodiment of the present invention.

FIG. 4 shows a third embodiment of the present invention. FIG. 4 is a schematic diagram showing a cross-section view of a DMOS device 400 of the present invention, which is formed in a substrate 41 and includes a field oxide regions 42a and 42b, gates 43a and 43b, a high voltage well 44, a drain 45, sources 46a and 46b, a body region 47, and a body electrode 47a. This embodiment is different from the first embodiment in that, as shown in FIG. 4, the DMOS device 400 further includes at least one N-type deep well 49 formed in the high voltage well 44 below the drain 45 and/or the gate 43b. Note that the N-type impurity density in the N-type deep well 49 is preferably higher than that of the high voltage well 44. Similar to the second embodiment, the third embodiment may further decrease the conduction resistance of the DMOS device 400 by reducing the resistance in the buried channel.

Figure 5:
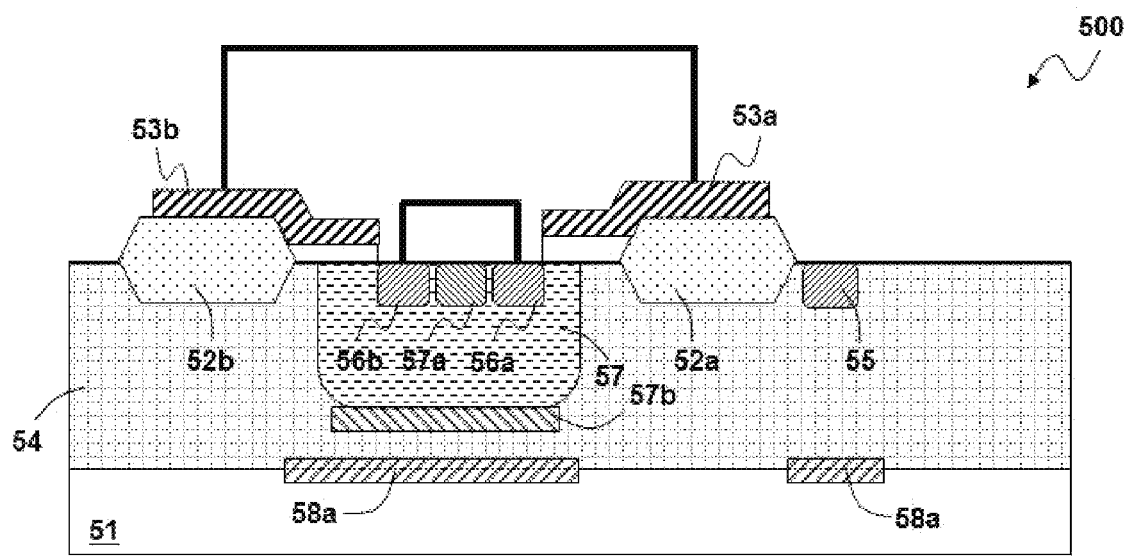
FIG. 5 shows a fourth embodiment of the present invention.

FIG. 5 shows a fourth embodiment of the present invention. FIG. 5 is a schematic diagram showing a cross-section view of a DMOS device 500 of the present invention. Similar to the second embodiment, as shown in FIG. 5, the DMOS device 500 is formed in a substrate 51 and includes a field oxide regions 52a and 52b, gates 53a and 53b, a high voltage well 54, a drain 55, sources 56a and 56b, a body region 57, a body electrode 57a, and at least one N-type buried layer 58a formed beneath and adjacent to the high voltage well 54 in a vertical direction. The DMOS device 500 further includes a P-type well 57b formed in the high voltage well 54 beneath the body region 57. Similar to the second embodiment, the fourth embodiment may further decrease the conduction resistance of the DMOS device 500 by reducing the resistance in the buried channel. Note that the P-type well 57b is preferably adjacent to the body region 57 in a vertical direction, and defined by a same mask with the body region 57. The function of the P-type well 57b is to reduce the impact of the N-type buried layer 58a on the body region 57.

Figure 6:
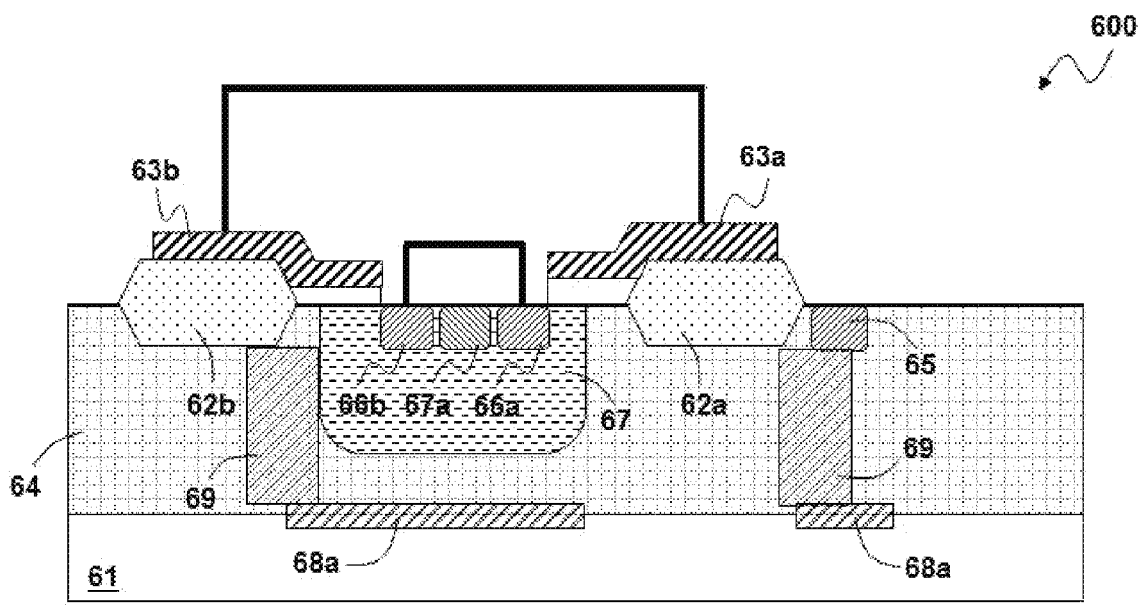
FIG. 6 shows a fifth embodiment of the present invention.

FIG. 6 shows a fifth embodiment of the present invention. FIG. 6 is a schematic diagram showing a cross-section view of a DMOS device 600 of the present invention. Similar to the second embodiment, as shown in FIG. 6, the DMOS device 600 is formed in a substrate 61 and includes a field oxide regions 62a and 62b, gates 63a and 63b, a high voltage well 64, a drain 65, sources 66a and 66b, a body region 67, and a body electrode 67a, and at least one N-type buried layer 68a formed beneath and adjacent to the high voltage well 64 in a vertical direction. The DMOS device 600 further includes at least one N-type deep well 69 formed in the high voltage well 64 below the drain 65 and/or the gate 63b. Similar to the second embodiment, the fifth embodiment may further decrease the conduction resistance of the DMOS device 600 by reducing the resistance in the buried channel. This embodiment indicates that the second embodiment and the third embodiment may be combined.

Figure 7A:
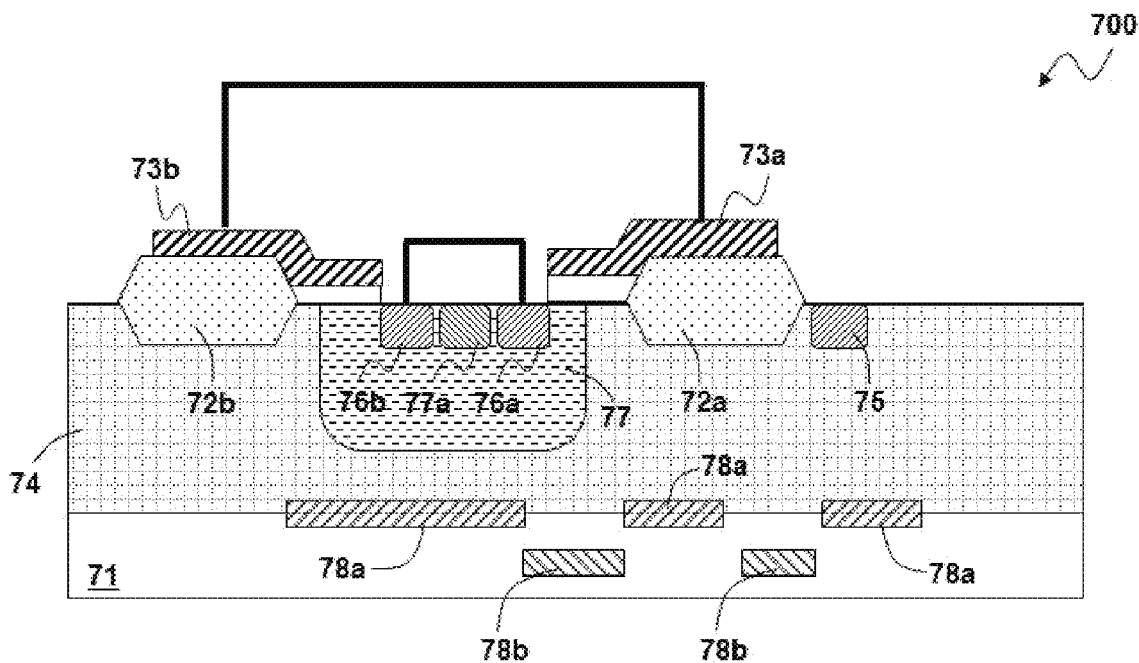
FIGS. 7A-7B show a sixth embodiment of the present invention.
Figure 7B:
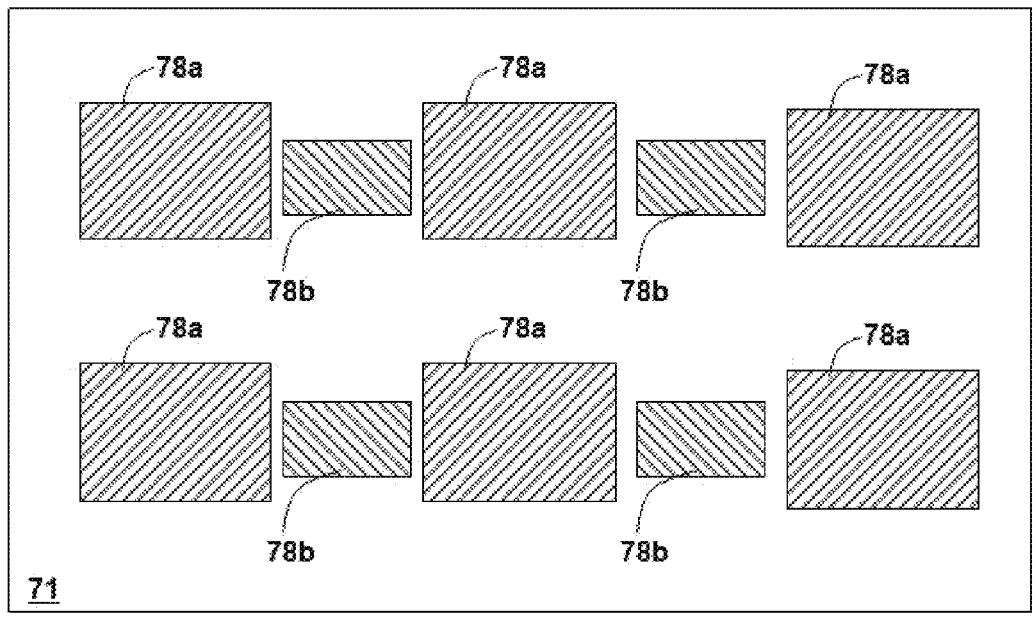

FIGS. 7A and 7B show a sixth embodiment of the present invention. FIGS. 7A and 7B are schematic diagrams showing a cross-section view and a top view of a DMOS device 700 of the present invention. Similar to the second embodiment, as shown in FIG. 7A, the DMOS device 700 is formed in a substrate 71 and includes a field oxide regions 72a and 72b, gates 73a and 73b, a high voltage well 74, a drain 75, sources 76a and 76b, a body region 77, and a body electrode 77a, and at least one N-type buried layer 78a formed beneath and adjacent to the high voltage well 74 in a vertical direction. The DMOS device 500 of this embodiment further includes at least one P-type buried layer 78b formed in the high voltage well 74 below the body region 77. Similar to the second embodiment, the sixth embodiment may further decrease the conduction resistance of the DMOS device 700 by reducing the resistance in the buried channel. This embodiment further enhances the depletion region in the high voltage well 74 in the OFF operation of the DMOS device 700, providing a better breakdown voltage. Note that the P-type impurity density in the buried layer 78b is preferably higher than that of the substrate 71, and in a preferable arrangement, as shown in FIG. 7B, the plural buried layers 78a and the buried layers 78b are arranged in alternative order from top view, such that the depletion region formed in the high voltage well 74 is enhanced.

Figure 8:
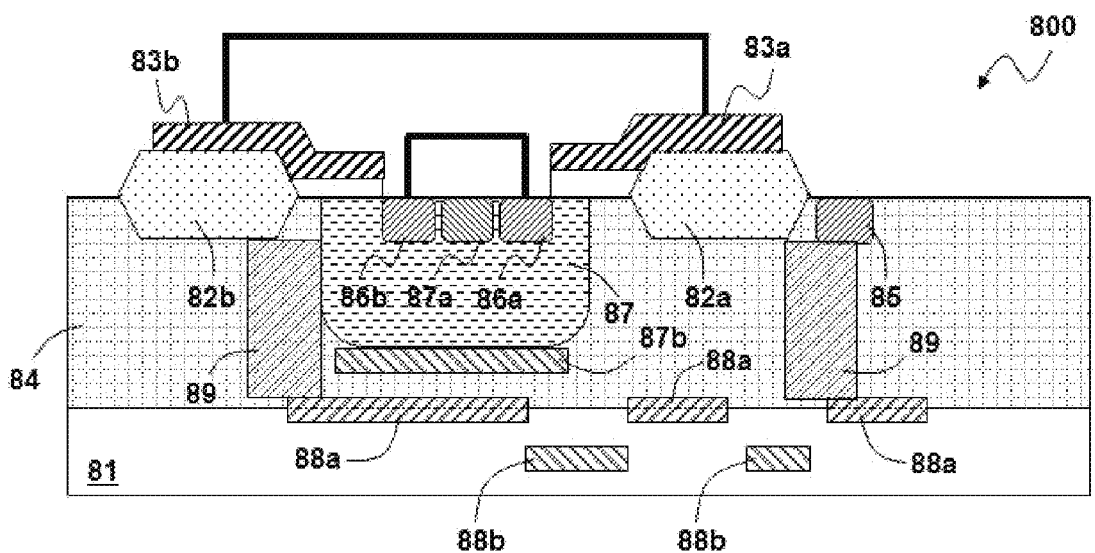
FIG. 8 shows a seventh embodiment of the present invention.

FIG. 8 shows a seventh embodiment of the present invention. FIG. 8 is a schematic diagram showing a cross-section view of a DMOS device 800 of the present invention. The DMOS device 800 is formed in a substrate 81 and includes a field oxide regions 82a and 82b, gates 83a and 83b, a high voltage well 84, a drain 85, sources 86a and 86b, a body region 87, and a body electrode 87a, at least one N-type buried layer 88a, at least one N-type deep well 89, a P-type well 87b formed beneath the body region 87, and at least one P-type buried layer 88b. This embodiment indicates that, all the aforementioned embodiments may be combined.

Figure 9:
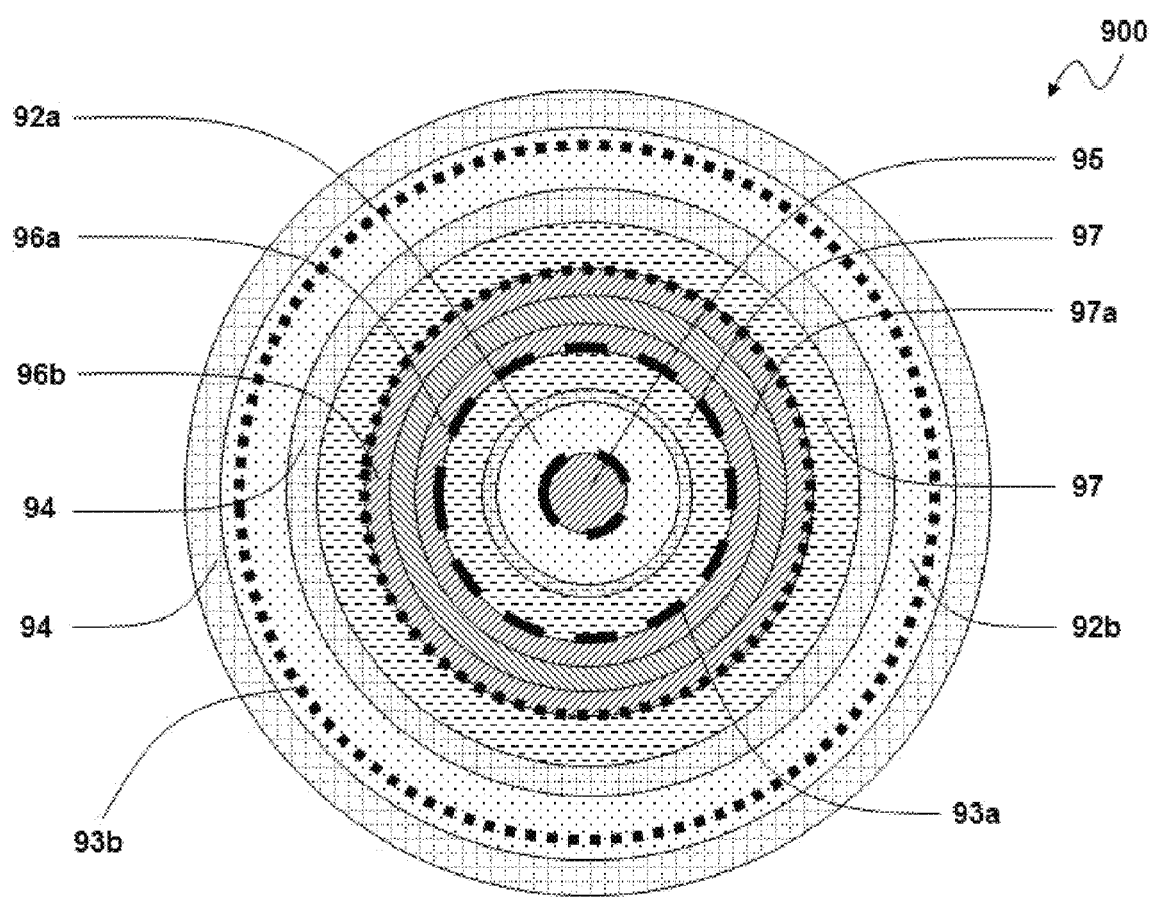
FIG. 9 shows an eighth embodiment of the present invention.

FIG. 9 shows an eighth embodiment of the present invention. FIG. 9 is a schematic diagram showing a top view of a DMOS device 900 of the present invention. As shown in FIG. 9, the DMOS device 900 includes field oxide regions 32a and 32b, gates 93a (as indicated by the bold sparse dash concentric circles in FIG. 9) and 93b (as indicated by the bold dense dash concentric circles in FIG. 9), a high voltage well 94, a drain 95, sources 96a and 96b, a body region 97, and a body electrode 97a. The DMOS device 900 further includes at least one N-type buried layer (not shown) formed beneath and adjacent to the high voltage well 94 in a vertical direction. This embodiment intends to show that the shape of the DMOS device of the present invention from top view is not limited, and as an example it can be a circle as shown in this embodiment.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, other process steps or structures which do not affect the primary characteristic of the device, such as a threshold voltage adjustment region, etc., can be added; for another example, the lithography step described in the above can be replaced by electron beam lithography, X-ray lithography, etc.; for another example, the conductive type of any region in the aforementioned DMOS devices may be changed, with modifications of the conductive types and the impurity densities of the other regions. In view of the foregoing, the spirit of the present invention should cover all such and other modifications and variations, which should be interpreted to fall within the scope of the following claims and their equivalents.

What is claimed is:

1. A double diffused metal oxide semiconductor (DMOS) device formed in a first conductive type substrate, wherein the substrate has an upper surface, the DMOS device comprising:
    a second conductive type high voltage well, which is formed in the substrate beneath the upper surface;
    a first field oxide region, which is formed on the upper surface, and is located in the high voltage well from top view;
    a first gate, which is formed on the upper surface, wherein a part of the first gate is above the first field oxide region;
    a second conductive type first source and a second conductive type drain, which are formed beneath the upper surface at two sides of the first gate respectively, wherein the drain and the first source are separated by the first gate and the first field oxide region from top view, and the drain is formed in the high voltage well;
    a first conductive type body region, which is formed in the high voltage well, wherein the first source is in the body region;

a first conductive type body electrode, which is formed in the body region as an electrical contact of the body region;

a second field oxide region, which is formed on the upper surface, and is located in the high voltage well from top view, wherein the second field oxide region and the first field oxide region is separated by the body region;

a second gate, which is formed on the upper surface, wherein a part of the second gate is above the second field oxide region, and another part of the second gate is above the body region, wherein the second gate is electrically connected to the first gate;

a second conductive type second source, which is formed beneath the upper surface in the body region at a side of the second gate, wherein the second source and the first source are electrically connected with each other; and a plurality of first buried layers formed beneath the high voltage well, each buried layer having a second conductive type impurity density higher than that of the high voltage well, wherein the plurality of first buried layers are not directly connected with one another.

2. The DMOS device of claim 1, further comprising a first conductive type well, which is formed in the high voltage well and beneath the body region.

3. The DMOS device of claim 2, wherein the first conductive type well is adjacent to the body region in a vertical direction, and defined by a same mask with the body region.

4. The DMOS device of claim 1, wherein when the DMOS device is ON, a surface channel is formed between the drain and the first source, and a buried channel is formed between the drain and the second source.

5. A double diffused metal oxide semiconductor (DMOS) device formed in a first conductive type substrate, wherein the substrate has an upper surface, the DMOS device comprising:

a second conductive type high voltage well, which is formed in the substrate beneath the upper surface;

a first field oxide region, which is formed on the upper surface, and is located in the high voltage well from top view;

a first gate, which is formed on the upper surface, wherein a part of the first gate is above the first field oxide region;

a second conductive type first source and a second conductive type drain, which are formed beneath the upper surface at two sides of the first gate respectively, wherein the drain and the first source are separated by the first gate and the first field oxide region from top view, and the drain is formed in the high voltage well;

a first conductive type body region, which is formed in the high voltage well, wherein the first source is in the body region;

a first conductive type body electrode, which is formed in the body region as an electrical contact of the body region;

a second field oxide region, which is formed on the upper surface, and is located in the high voltage well from top view, wherein the second field oxide region and the first field oxide region is separated by the body region;

a second gate, which is formed on the upper surface, wherein a part of the second gate is above the second field oxide region, and another part of the second gate is above the body region, wherein the second gate is electrically connected to the first gate;

a second conductive toe second source, which is formed beneath the upper surface in the body region at a side of the second gate, wherein the second source and the first source are electrically connected with each other;

at least one first buried layer formed beneath the high voltage well, the buried layer having a second conductive type impurity density higher than that of the high voltage well; and at least one first conductive type second buried layer, formed in the substrate below the high voltage well.

6. The DMOS device of claim 5, wherein the DMOS device includes a plurality of the second buried layers, each having a first conductive type impurity density higher than that of the high voltage well, and the plural second buried layers and the at least one second conductive type first buried layer are arranged in alternative order from top view.

7. The DMOS device of claim 5, wherein when the DMOS device is ON, a surface channel is formed between the drain and the first source, and a buried channel is formed between the drain and the second source.

8. A double diffused metal oxide semiconductor (DMOS) device formed in a first conductive type substrate, wherein the substrate has an upper surface, the DMOS device comprising:

a second conductive type high voltage well, which is formed in the substrate beneath the upper surface;

a first field oxide region, which is formed on the upper surface, and is located in the high voltage well from to view;

a first gate, which is formed on the upper surface, wherein a part of the first gate is above the first field oxide region;

a second conductive type first source and a second conductive type drain, which are formed beneath the upper surface at two sides of the first gate respectively, wherein the drain and the first source are separated by the first gate and the first field oxide region from to view, and the drain is formed in the high voltage well;

a first conductive type body region, which is formed in the high voltage well, wherein the first source is in the body region;

a first conductive type body electrode, which is formed in the body region as an electrical contact of the body region;

a second field oxide region, which is formed on the upper surface, and is located in the high voltage well from top view, wherein the second field oxide region and the first field oxide region is separated by the body region;

a second gate, which is formed on the upper surface, wherein a part of the second gate is above the second field oxide region, and another part of the second gate is above the body region, wherein the second gate is electrically connected to the first gate;

a second conductive type second source, which is formed beneath the upper surface in the body region at a side of the second gate, wherein the second source and the first source are electrically connected with each other; and at least one two second conductive type deep wells, one of which is formed in the high voltage well below the drain and/or the second gate and the other of which is formed below the second field oxide region.

9. The DMOS device of claim 8, wherein the deep well has a second conductive type impurity density higher than that of the high voltage well.

10. The DMOS device of claim 8, wherein when the DMOS device is ON, a surface channel is formed between the drain and the first source, and a buried channel is formed between the drain and the second source.

* * * * *